US012804922B2

(12) United States Patent
Gauthier et al.

(10) Patent No.: US 12,804,922 B2
(45) Date of Patent: Nov. 17, 2026

(54) TRANSISTOR MANUFACTURING METHOD

(71) Applicant: STMicroelectronics (Crolles 2) SAS, Crolles (FR)

(72) Inventors: Alexis Gauthier, Meylan (FR); Pascal Chevalier, Chapareillan (FR); Edoardo Brezza, Grenoble (FR); Nicolas Guitard, Allevard (FR); Gregory Avenier, Saint Nazaire les Eymes (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 375 days.

(21) Appl. No.: 18/387,627

(22) Filed: Nov. 7, 2023

(65) Prior Publication Data

US 2024/0162328 A1 May 16, 2024

(30) Foreign Application Priority Data

Nov. 10, 2022 (FR) ...................................... 2211712

(51) Int. Cl.

*H10D 10/01* (2025.01)
*H10D 62/13* (2025.01)
*H10D 62/17* (2025.01)

(52) U.S. Cl.

CPC ........... *H10D 10/01* (2025.01); *H10D 62/133* (2025.01); *H10D 62/137* (2025.01); *H10D 62/177* (2025.01)

(58) Field of Classification Search

None
See application file for complete search history.

(56) References Cited

U.S. PATENT DOCUMENTS

| | | | | |
|---|---|---|---|---|
| 2013/0270649 | A1* | 10/2013 | Chantre | H10D 10/021 257/378 |
| 2015/0140771 | A1* | 5/2015 | Fox | H10D 62/133 438/320 |
| 2019/0148531 | A1 | 5/2019 | Gauthier et al. | |
| 2020/0111890 | A1 | 4/2020 | Gauthier et al. | |
| 2021/0091183 | A1 | 3/2021 | Holt et al. | |

OTHER PUBLICATIONS

INPI Search Report and Written Opinion for priority application, FR Appl. No. 2211712, report dated May 25, 2023, 10 pgs.
Fox, Alexander, et al.: "Advanced Heterojunction Bipolar Transistor for Half-THz SiGe BiCMOS Technology," IEEE Electron Device Letters, vol. 36, No. 7, Jul. 2015, 3 pgs.
Phillips, S., et al.: "Advances in Foundry SiGe HBT BiCMOS Processes Through Modeling and Device Scaling for Ultra-High Speed Applications," IEEE, 2021, 9 pgs.
Pekarik, John, et al.: "SiGe HBTs with fT/fMAX—375/510GHz Integrated in 45nm PDSOI CMOS," IEEE 2021, 4 pgs.

* cited by examiner

*Primary Examiner* — Jay C Chang
(74) *Attorney, Agent, or Firm* — Crowe & Dunlevy LLC

(57) ABSTRACT

A bipolar transistor is manufactured by: forming a collector region; forming a first layer made of a material of a base region and an insulating second layer; forming a cavity reaching the collector region; forming a portion of the collector region and a portion of the base region in the cavity; forming an insulating fourth layer made of a same material as the insulating second layer in the periphery of the bottom of the cavity, the insulating fourth layer having a same thickness as the insulating second layer; forming an emitter region; and simultaneously removing the insulating second and a portion of the insulating fourth layer not covered by the emitter region.

25 Claims, 5 Drawing Sheets

TRANSISTOR MANUFACTURING METHOD

PRIORITY CLAIM

This application claims the priority benefit of French Application for Patent No. 2211712, filed on Nov. 10, 2022, the content of which is hereby incorporated by reference in its entirety to the maximum extent allowable by law.

TECHNICAL FIELD

The present disclosure generally concerns electronic devices and, in particular, electronic devices comprising doped regions and their manufacturing methods.

BACKGROUND

A bipolar transistor is an electronic device based on a semiconductor of the family of transistors. Its operating principle is based on two PN junctions, one forward and the other reverse.

The operation of bipolar transistors depends on a large number of characteristics of bipolar transistors. Such a characteristic of bipolar transistors is their maximum oscillation frequency.

There is a need for bipolar transistors having a higher maximum oscillation frequency.

There is a need to overcome all or part of the disadvantages of known semiconductor region manufacturing methods.

SUMMARY

An embodiment provides a method of manufacturing a bipolar transistor comprising: a) manufacturing a first portion of a collector region in a substrate; b) forming a stack of layers comprising a first layer made of a material of a base region and a second insulating layer made of a first material; c) forming a cavity crossing the stack and the substrate to reach the first portion of the collector region; d) forming a second portion of the collector region and of a first portion of the base region in the cavity; e) forming a fourth layer made of the same material as the second layer, having the same thickness as the second layer in the periphery of the bottom of the cavity; f) forming an emitter region in front of the first portion of the base region, the fourth layer being partially exposed; and g) simultaneously removing the second and fourth layers.

According to an embodiment, step a) comprises forming an insulating layer covering a portion of the first portion of the collector region, the cavity crossing the insulating layer.

According to an embodiment, the stack of layers comprises a fifth insulating layer, the first layer, and the second layer located between two sixth insulating layers, the sixth layers being made of materials different from the material of the second layer.

According to an embodiment, the second portion of the collector region and the first portion of the base region are formed by epitaxial growth in the cavity.

According to an embodiment, step e) comprises forming the fourth layer over the entire structure, forming spacers on the fourth layer against the lateral walls of the cavity, where a central portion of the bottom of the cavity is not covered with the spacers, and etching the portions of the fourth layer which are not covered with the spacers.

According to an embodiment, the method comprises, between steps f) and g), a step f1) removing the spacers and the sixth layer covering the second layer.

According to an embodiment, step f) comprises forming a seventh layer made of the material of the emitter region and etching the seventh layer to partially expose the fourth layer around the emitter region.

According to an embodiment, the method comprises, after step g), a step h) epitaxially growing the first layer.

According to an embodiment, the method comprises, after step h), a step i) etching the first layer and the fifth layer, to partially expose the first portion of the collector region.

According to an embodiment, the method comprises, after step i), forming contact layers on the base, collector, and emitter regions.

According to an embodiment, the thickness of the second and fourth layers is in the range from 5 nm to 30 nm.

Another embodiment provides a device comprising a bipolar transistor wherein a contact layer of a base region of the transistor is separated from an emitter region by a portion of the base region and an insulating layer portion covered with the emitter region.

According to an embodiment, the base region rests on a portion of a collector region of the transistor, the horizontal dimensions of the emitter region being smaller than the horizontal dimensions of the portion of the collector region.

According to an embodiment, the horizontal dimensions of the emitter region are smaller by 180 nm than the horizontal dimensions of the portion of the collector region.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for the understanding of the described embodiments have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms “front”, “back”, “top”, “bottom”, “left”, “right”, etc., or relative positions, such as terms “above”, “under”, “upper”, “lower”, etc., or to terms qualifying directions, such as terms “horizontal”, “vertical”, etc., it is referred, unless specified otherwise, to the orientation of the drawings.

Unless specified otherwise, the expressions "about", "approximately", "substantially", and "in the order of" signify plus or minus 10%, preferably of plus or minus 5%.

Unless specified otherwise, the expressions "insulating" or "conductive" signify "electrically-insulating" or "electrically-conductive".

Figure 1:
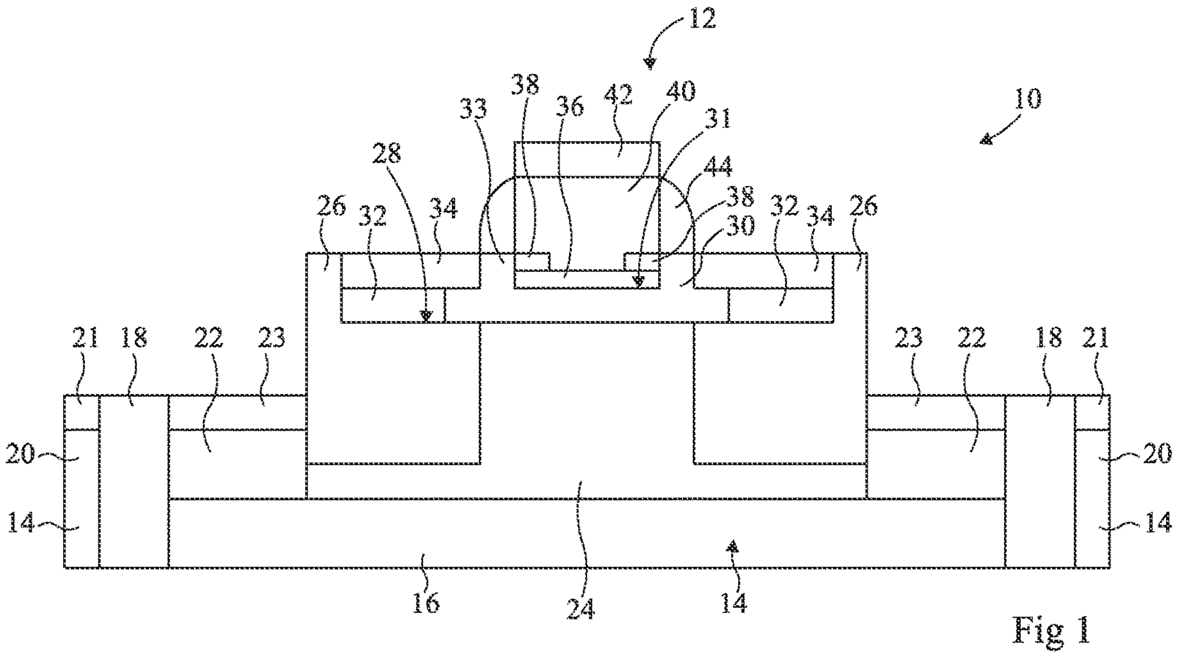
FIG. 1 shows an embodiment of an electronic device.

FIG. 1 shows an embodiment of an electronic device 10. More precisely, FIG. 1 shows an embodiment of an electronic device 10 comprising a bipolar transistor 12.

Bipolar transistor 12 is formed in a substrate 14. More precisely, transistor 12 is formed in the substrate and on an upper surface of substrate 14. The substrate is made of a semiconductor material, for example of silicon. Transistor 12 comprises a region 16 of substrate 14. Region 16 is a buried region of substrate 14. In other word, region 16 does not extend all the way to the upper region of substrate 14. Region 16 is preferably not doped.

Transistor 12 further comprises an insulating wall 18. Wall 16 is made of an electrically-insulating material, for example of silicon oxide. Wall 16 extends in substrate 14, for example from the upper surface. For example, wall 18 laterally surrounds region 16. As a variant, the transistor may comprise a plurality of walls 18, walls 18 laterally delimiting region 16 on at least certain sides.

Transistor 12 further comprises regions 20 of substrate 14. Regions 20 are made of a material identical to region 16. Preferably, regions 20 have the same doping as region 16. For example, regions 20 are not doped. Regions 20 are partially separated from region 16 by wall(s) 18. Regions 20 are physically and electrically coupled to region 16 under wall 18. Thus, the biasing of region 20 causes the biasing of region 16.

Transistor 12 comprises a conductive layer 21. Layer 21 covers, preferably entirely, preferably only, the upper surface of region 20. Layer 21 is made of an electrically-conductive material, for example of a metal. Layer 21 corresponds to the contact of the substrate of transistor 12.

Transistor 12 further comprises a region 22 in substrate 14. Region 22 is located inside of wall 18. Region 22 extends from the upper surface of substrate 14 to region 16. Region 22 preferably extends along the inner lateral surface of wall 18. Region 22 is thus preferably in contact with wall 18.

Region 22 is made of the semiconductor material of substrate 14, for example of silicon. Region 22 is doped with a first conductivity type, preferably n-type doped. Region 22 corresponds to a portion of the collector of transistor 12.

Transistor 12 comprises a conductive layer 23. Layer 23 covers, preferably entirely, preferably only, the upper surface of region 22. Layer 23 is made of an electrically-conductive material, for example of a metal. Layer 23 corresponds to the contact of the collector of transistor 12.

Region 22 laterally surrounds a portion of region 24 of transistor 12. Region 24 is located inside of wall 18 and inside of region 22. Region 24 extends from the upper surface of region 16 and towards the upper surface of substrate 14. Region 24 preferably extends along the inner lateral surface of region 22. Region 22 is thus preferably in contact with region 24. Region 24 preferably comprises a first portion extending in a plane parallel to the upper surface of region 16. The first portion extends in the entire area surrounded with region 22. The first portion extends on region 16. The first portion is thus in contact with region 16 and with region 22. Region 24 comprises a second portion extending from the upper surface of the first portion and extends towards the upper surface of substrate 14. The second portion extends, for example, from the center of the first portion.

Region 24 is made of the semiconductor material of substrate 14 and of region 22, for example of silicon. Region 24 is less heavily doped with the same conductivity type as region 22, for example with the first conductivity type, preferably n-type doped. Region 24 corresponds to another portion of the collector of transistor 12. Thus, the collector of transistor 12 comprises regions 22 and 24.

Preferably, region 24 has a doping level, that is, a concentration of dopants of the first type, lighter than the doping level, that is, than the dopant concentration, of region 22.

A region 26 laterally surrounds the second portion of region 24. Region 26 is made of an electrically-insulating material, for example silicon oxide. Region 26 extends on the first portion of region 24, around the second portion of region 24. Region 26 extends from the upper surface of the first portion of region 24 at least all the way to the level of the upper surface of the second portion of region 24. Thus, region 26 extends all along the height of the second portion of region 24. Preferably, the second portion of region 24 and region 26 extend all the way to a level higher than the level of the upper surface of region 22. The upper surface of the first portion of region 24 is preferably entirely covered with the second portion of region 24 and with region 26.

Region 26 extends, on the external side, that is, the side most distant from the second portion of region 24, along a height greater than on the inner side. Region 26 thus forms, at the level of its upper surface, a step. The assembly comprising region 26 and the second portion of region 24 thus comprises a cavity 28, laterally delimited with region 26, and more precisely the portion of region 26 having a height greater than the rest of region 26. The bottom of cavity 28 is formed by region 26, and more precisely by the portion of region 26 having the lowest height, and by the upper surface of the second portion of region 24.

Transistor 12 further comprises a region 30. Region 30 is located in cavity 28. In other words, region 30 is located on a portion of region 26 and on the second portion of region 24 and is located inside of the wall formed by the portion of region 26 having a greater height. Region 30 preferably comprises a first portion corresponding to a layer and a second portion 33 extending from the first portion to form a cavity 31 in region 30. The bottom of cavity 31 is formed by the first portion of region 30 and the lateral walls of cavity 31 are formed by the second portion 33 of region 30. Preferably, second portion 33 is located in such a way that region 30 comprises an edge around portion 33.

Region 30 covers, preferably entirely, the upper surface of the second portion of region 24. Region 30 partially covers, for example, the upper surface of region 26 located in cavity 28. Region 30 is preferably located at the center of cavity 28. The portion of the bottom of cavity 28 covered with region 30 is surrounded with a portion of the bottom of cavity 28 which is not covered with region 30.

Region 30 is, for example, made of the semiconductor material of substrate 14, for example of silicon. Region 30 is doped with a second conductivity type, that is, the conductivity type opposite to the first conductivity type, preferably p-type doped. Region 30 corresponds to a portion of the base of transistor 12.

Transistor 12 comprises a region 32 located in cavity 28. Region 32 covers the bottom of cavity 28 which is not covered with region 30. Thus, region 28 laterally surrounds the first portion of region 30. The bottom of cavity 38 is thus preferably entirely covered with regions 30 and 32. Region 32 preferably does not cover the upper surface of region 24. Region 32 has, for example, the same height as the first portion of region 30.

Region 32 is, for example, made of polysilicon. Region 32 is doped with the same conductivity type as region 30, that is, the second conductivity type, that is, the conductivity type opposite to the first conductivity type, preferably p-type doped. Region 32 corresponds to a portion of the base of transistor 12. Regions 30 and 32 thus form the base of transistor 12.

Preferably, region 30 has a doping level, that is, a concentration of dopants of the second type, lighter than the doping level, that is, than the dopant concentration, of region 32.

Transistor 12 comprises a conductive layer 34. Layer 34 covers, preferably entirely, the upper surface of region 32. Layer 34 partially covers, for example, region 30. Thus, layer 34 rests on the edge of region 30. Layer 34 is made of an electrically-conductive material, for example of a metal. Layer 34 corresponds to the contact of the base of transistor 12.

Transistor 12 further comprises a layer 36 located in cavity 31. In other words, layer 36 covers, preferably entirely, the bottom of cavity 31. In other words, layer 36 extends on the first portion of region 30, laterally surrounded with the second portion 33 of region 30. The height of layer 36 is preferably lower than the height of portion 33. Layer 36 is, for example, made of the same material as substrate 14, for example of silicon. The material of layer 36 is preferably not doped.

Transistor 12 comprises an insulating layer 38. Layer 38 is, for example, made of silicon oxide. Layer 38 extends over a portion of layer 36. Layer 38 extends over the periphery of layer 36. Layer 38 is preferably in contact with portion 33 all along the contour of cavity 31 and extends towards the center of layer 36. Layer 38 does not entirely cover layer 36. A central portion of layer 36 is not covered with layer 38.

Transistor 12 further comprises a region 40. Region 40 covers layer 38 and the central portion of layer 36, that is, the portion not covered with layer 38. Region 40 is thus in contact with layer 36. The lateral walls of region 40 are coplanar with the lateral walls of layers 36 and 38. Thus, the lateral walls of region 40 are coplanar with the inner lateral walls of portion 33, that is, the lateral walls of portion 33 closest to layer 38.

Region 40 is made of polysilicon. Region 40 is doped with the same conductivity type as regions 22 and 24. Region 40 is, for example, n-type doped. Region 40 forms the emitter of transistor 12.

The horizontal dimensions of the emitter region are smaller than the horizontal dimensions of the collector region portion. The horizontal dimensions of the emitter region are smaller by 180 nm than the horizontal dimensions of the second portion of the collector region.

Transistor 12 comprises a conductive layer 42. Layer 42 covers, preferably entirely, preferably only, the upper surface of region 40. Layer 42 is made of an electrically-conductive material, for example of a metal. Layer 42 corresponds to the contact of the emitter of transistor 12.

Transistor 12 further comprises spacers 44. Spacers 44 extend on the lateral walls of region 40, preferably on all the lateral walls of region 40. Spacers 44 extend, preferably vertically, from portion 33 to the upper level of region 40. The spacers extend, preferably horizontally, from the lateral walls of region 40 to the level of the interface between portion 33 and layer 34.

The extrinsic base resistance is a characteristic of bipolar transistors. The extrinsic base resistance is equal to the multiplication of a resistivity value by the distance between layer 34 and region 40. Thus, in the embodiment of FIG. 1, the extrinsic base resistance is thus equal to the multiplication of a resistivity value by the sum of the width of portion 33 and the width of layer 38.

The maximum oscillation frequency is such that the higher the extrinsic base resistance, the lower said frequency, and conversely. Thus, the maximum oscillation frequency of the transistor of FIG. 1 is higher than that of a bipolar transistor comprising regions of additional materials between layer 34 and region 40.

FIG. 2A, FIG. 2B, FIG. 2C, FIG. 2D, FIG. 2E, FIG. 2F, FIG. 2G, FIG. 2H, FIG. 2I, FIG. 2J show steps, preferably successive, of a method of manufacturing the embodiment of FIG. 1.

Figure 2A:
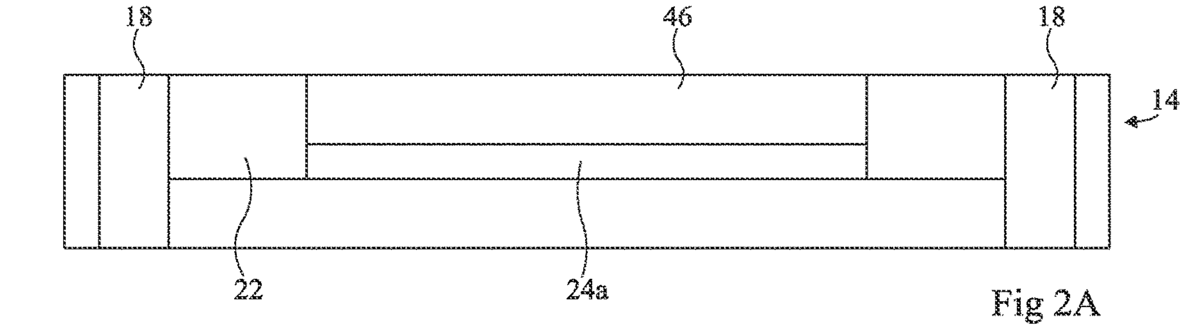
FIG. 2A, FIG. 2B, FIG. 2C, FIG. 2D, FIG. 2E, FIG. 2F, FIG. 2G, FIG. 2H, FIG. 2I, FIG. 2J show devices resulting from steps of a method of manufacturing the embodiment of FIG. 1.

FIG. 2A shows a device resulting from a step of a method of manufacturing the embodiment of FIG. 1.

During this step, insulating walls 18 are formed in substrate 14. Insulating walls 18 thus delimit an area where the base, the collector, and the emitter of transistor 12 are formed. The height of walls 18 is lower than the height of substrate 14. Thus, a portion of substrate 14, not shown, extends under walls 18.

The step of FIG. 2A further comprises the forming of region 22 and of a region 24*a* corresponding to the first portion of region 24 of FIG. 1. Regions 22 and 24*a* are, for example, formed by doping of regions of substrate 14. Regions 22 and 24*a* are preferably doped to have the doping levels described in relation with FIG. 1.

The step of FIG. 2A comprises the forming of an insulating region 46 in substrate 14. Region 46 is made of the material of region 26, for example of silicon oxide. Region 46 covers, preferably entirely, preferably only, region 24*a*. Thus, region 46 preferably extends from the upper surface of region 24*a* to the upper level of substrate 14. The height of region 46 is such that region 24*a* has the height of the first portion of region 24.

Figure 2B:
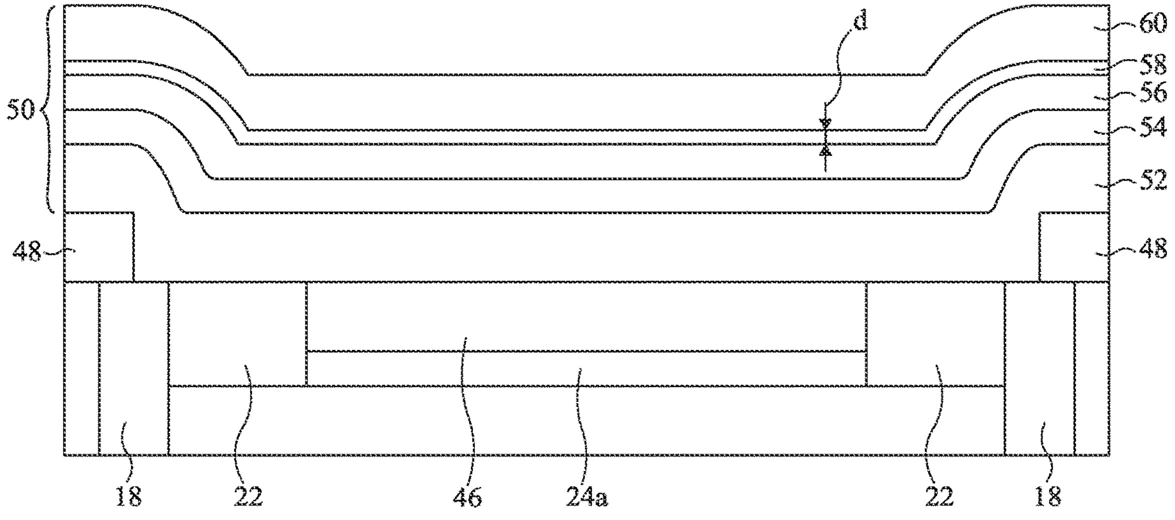

FIG. 2B shows a device resulting from a step of the method of manufacturing the embodiment of FIG. 1.

During this step, elements 48 are formed. Elements 48 cover, preferably entirely, the locations of layers 20. In other words, elements 48 cover the upper surface of the substrate 14 directly around walls 18. Elements 48 cover, for example at least partially, walls 18. Elements 48 preferably do not cover regions 22 and region 46.

Elements 48 are, for example, made of a semiconductor material. Elements 48 are, for example, made of polysilicon. Elements 48 are, for example, made of a non-doped material.

The step of FIG. 2B further comprises the forming of a stack 50 of layers. Stack 50 entirely covers, for example, the structure resulting from the forming of elements 48. In particular, stack 50 covers, preferably entirely, elements 48, the portions of walls 18 not covered with elements 48, regions 22, and region 24*a*.

Stack 50 comprises a lower layer 52. Layer 52 is thus the layer of the stack closest to substrate 14. Layer 52 conformally covers the structure resulting from the forming of elements 48. Layer 52 is made of an insulating material, for example the same material as region 46, for example the same material as region 26 of FIG. 1. Layer 52 is, for example, made of silicon oxide.

Stack 50 comprises a layer 54 covering layer 52. Layer 54 covers, preferably entirely, preferably conformally, layer 52. Layer 54 is preferably made of the material of region 32.

Layer 54 is preferably made of polysilicon. Layer 54 is preferably p-type doped. Thus, layer 54 is preferably made of p-type doped polysilicon.

Stack 50 comprises a layer 56 covering layer 54. Layer 56 covers, preferably entirely, preferably conformally, layer 54. Layer 56 is made of an insulating material. Layer 56 is made of an insulating material different from the material of layer 52. Layer 56 is, for example, made of silicon nitride.

Stack 50 comprises a layer 58 covering layer 56. Layer 58 covers, preferably entirely, preferably conformally, layer 56. Layer 58 is made of an insulating material. Layer 58 is, for example, made of the same material as layer 52. Layer 58 is made of a material different from the material of layer 56. Layer 58 [56] is, for example, made of silicon oxide. Layer 58 has a thickness d. The thickness of layer 58 is, for example, substantially constant, for example constant. In particular, the thickness of layer 58 is, for example, substantially constant, for example constant, at least in the area located in front of region 46.

Stack 50 comprises a layer 60 covering layer 58. Layer 60 covers, preferably entirely, preferably conformally, layer 58. Layer 60 is made of an insulating material. Layer 60 is made of an insulating material different from the material of layer 58. Layer 60 is, for example, made of the same material as layer 56. Layer 60 is, for example, made of silicon nitride.

Figure 2C:
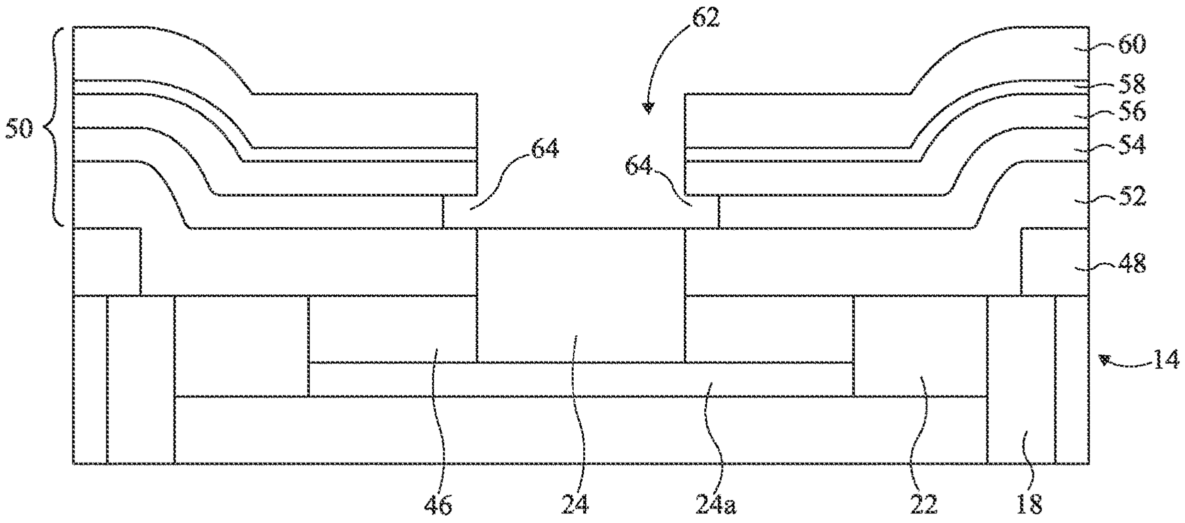

FIG. 2C shows a device resulting from a step of the method of manufacturing the embodiment of FIG. 1.

During this step, a cavity 62 is formed. Cavity 62 extends from the upper surface of layer 60 to the upper surface of layer 24*a*. In other words, the cavity crosses the layers of stack 50, that is, layers 60, 58, 56, 54, 52, as well as region 46.

Cavity 62 is located at the location of the second portion of region 24. Thus, the lateral walls of cavity 62 partially correspond to the lateral walls of the second portion of region 24.

The step of FIG. 2C further comprises the forming of the second portion of region 24. In other words, the second portion of region 24 is formed at the bottom of cavity 62. More precisely, the step of FIG. 2C comprises the epitaxial growth of the second portion of region 24 from layer 24*a*. The epitaxial growth is preferably maintained until the second portion of region 24, that is, the portion formed during this epitaxial growth step, extends all the way to the level of the upper surface of layer 52.

The epitaxial growth step causes the consumption of the material of layer 54 accessible from cavity 62. Thus, layer 54 is partially etched from the lateral walls of cavity 62. Cavities 64 are thus formed around cavity 62, at the locations of a portion of layer 54. The height of cavities 64, for example corresponding to the height of layer 54, is in the range, for example, from 5 nm to 20 nm. The depth of cavities 54, that is, the distance between the lateral surface of layer 54 forming the bottom of cavity 54 and the opening of cavity 54, is in the range from 5 nm to 50 nm.

Figure 2D:
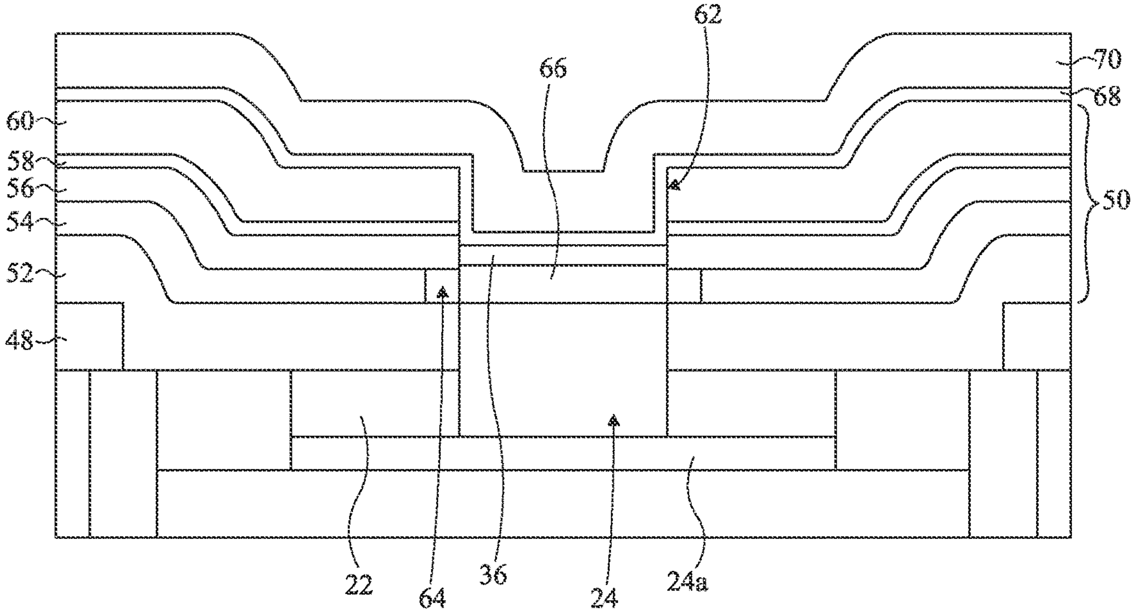

FIG. 2D shows a device resulting from a step of the method of manufacturing the embodiment of FIG. 1.

During this step, a region 66 is formed in cavity 62. Region 66 corresponds to a portion of the region 30 of FIG. 1. Region 66 is, for example, formed by epitaxial growth, from region 24. Region 66 covers, preferably entirely, the upper surface of the portion of region 24 in cavity 62. Region 66 thus fills the bottom of cavity 62 after the forming of the portion of region 24. Region 66 preferably extends from the upper surface of region 24 all the way to the level of the upper surface of layer 54. Region 66 preferably does not extend in cavities 64 so as to lead void areas at the location of cavities 64 which are closed off by the region 66 that partially fills cavity 62.

Region 66 is made of the material of region 30 of FIG. 1. Thus, region 66 is preferably made of p-type doped silicon. The doping level of region 66 is for example substantially equal to the doping level of region 30 of FIG. 1.

The step of FIG. 2D further comprises the forming of layer 36. Layer 36 is formed on the upper surface of region 66. Layer 36 covers, preferably entirely, preferably only, the upper surface of region 66. Layer 36 is, for example, formed by epitaxial growth. The height of layer 36 is, for example, lower than the thickness of layer 54.

Alternatively, region 66 and layer 36 are, for example, such that the upper surface of layer 36 is substantially coplanar with the upper surface of layer 56.

The step of FIG. 2D comprises the forming of an insulating layer 68. Layer 68 conformally covers the structure resulting from the forming of layer 36. Thus, layer 68 covers the upper surface of layer 60, the lateral walls of cavity 62, that is, the lateral surfaces of layers 60, 58, and 56 located in cavity 62, and the upper surface of layer 36. Layer 68 is thus in contact with the lateral surfaces of layers 60, 58, and 56.

Layer 68 is made of the same material as layer 58, for example of silicon oxide. The material of layer 68 is different from the material of layer 60. The thickness of layer 68 is substantially identical, preferably identical, to the thickness of layer 58. The thickness of layers 58 and 68 is in the range from 5 nm to 30 nm.

The step of FIG. 2D comprises the forming of insulating layer 70. Layer 70 conformally covers the structure resulting from the forming of layer 68. Thus, layer 70 covers, preferably entirely, preferably only, the upper surface of layer 68.

Layer 70 is made of a material different from the material of layer 68. Layer 70 is, for example, made of the same material as layer 60, for example of silicon nitride.

Figure 2E:
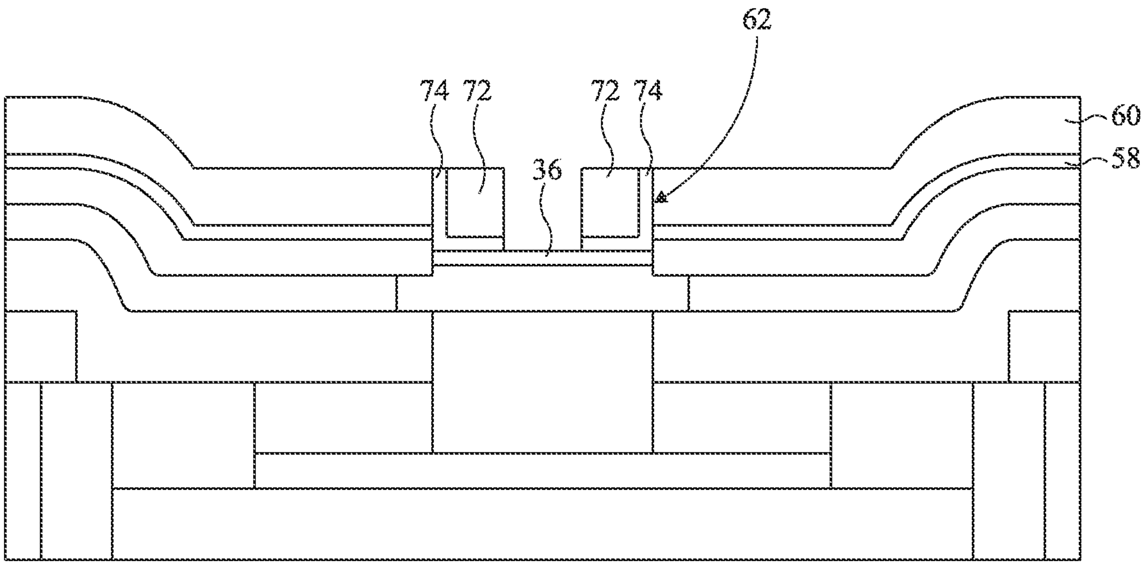

FIG. 2E shows a device resulting from a step of the method of manufacturing the embodiment of FIG. 1.

The step of FIG. 2E comprises a step of anisotropic etching of layer 70. This etch step is preferably configured to only etch layer 70 (i.e., the etch is selective as to the material of layer 70). This etch step is, for example, configured not to etch layer 68. Layer 70 is entirely etched during this etch step, except for spacers 72. Spacers 72 are located at the level of the lateral walls of cavity 62. The spacers cover portions 74 of layer 68 having, in cross-section view, an L shape. Spacers 72 do not entirely fill cavity 62. Thus, a central portion of cavity 62 is not covered with spacers 72.

The step of FIG. 2E then comprises a step of etching of layer 68. Layer 68 is preferably entirely etched except for the portions 74 covered with spacers 72. Portions 74 comprise a horizontal portion extending, under spacers 72, on the upper surface of layer 36, from the lateral surfaces of cavity 62 to the center of cavity 62. The horizontal portions of portions 74 are such that a portion, for example a substantially central portion, of the upper surface of layer 36 is not covered with portions 74. Portions 74 further comprise a vertical portion extending on the lateral walls of cavity 62, for example from the upper surface of layer 36 to the upper surface of layer 60.

Figure 2F:
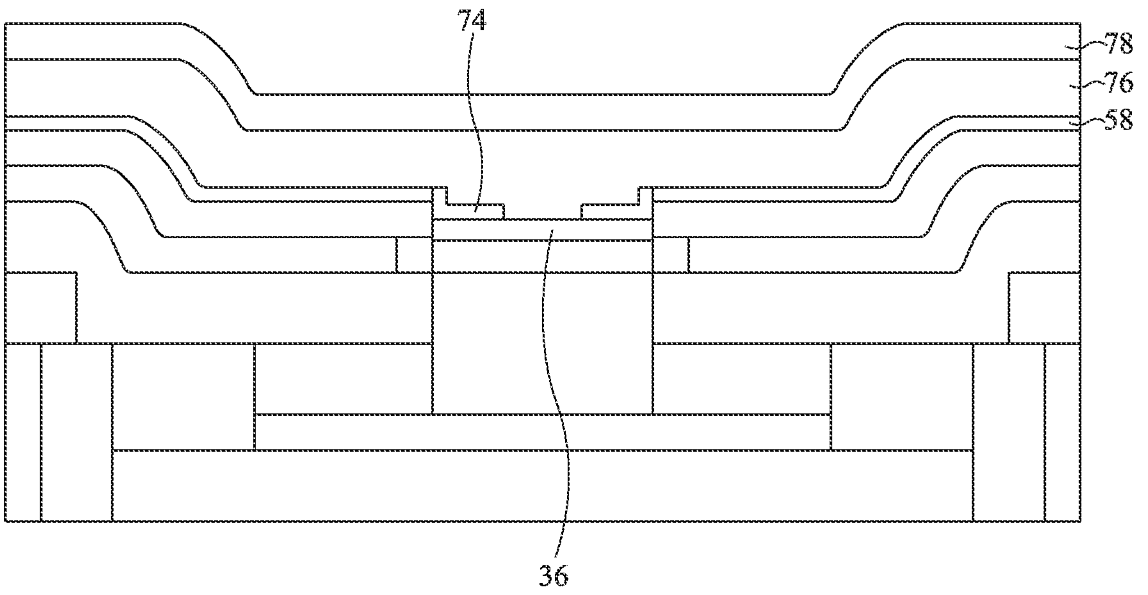

FIG. 2F shows a device resulting from a step of the method of manufacturing the embodiment of FIG. 1.

The step of FIG. 2F comprises a step of etching of layer 60 and of spacers 72. Spacers 72 are made of the same material as layer 60. Spacers 72 and layer 60 can thus be etched by the same etching. The etching is, for example, a wet etching.

During this etch step, the vertical portion of portions 74 is at least partially etched. For example, the vertical portion of portions 74 is etched all the way to the level of the upper surface of layer 68. Layer 58 and the rest of portions 74 thus form a layer of constant thickness.

The step of FIG. 2F further comprises the forming of a layer 76 on the structure resulting from the etching of layer 60 and of portions 74. Layer 76 thus covers, preferably entirely, preferably only, layer 58, portions 74, and the portion of layer 36 which is not covered with portions 74.

Layer 76 is made of the material of region 40 of FIG. 1, that is, for example of n-type doped polysilicon. The doping of layer 76 is, for example, substantially equal, for example equal, to the doping of region 40 of FIG. 1.

The step of FIG. 2F further comprises the forming of an insulating layer 78. Layer 78 covers, preferably entirely, preferably only, layer 76. Layer 78 is made of an insulating material, preferably the same material as layer 58, for example silicon oxide.

Figure 2G:
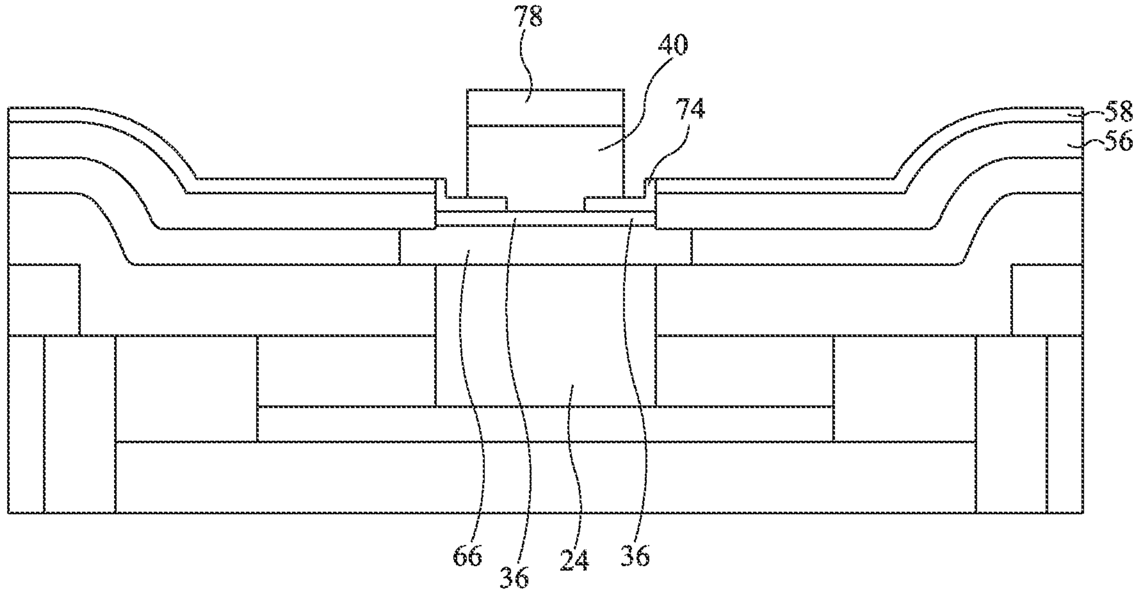

FIG. 2G shows a device resulting from a step of the method of manufacturing the embodiment of FIG. 1.

During this step, layers 76 and 78 are etched to form region 40 covered with a portion of layer 78. Layers 76 and 78 are, for example, simultaneously etched. Layers 76 and 78 are etched in such a way that the remaining lateral walls of region 40 and of layer 78 are coplanar.

Further, layers 76 and 78 are etched in such a way that the remaining lateral walls of region 40 and of layer 78 are located in front of cavity 62, that is, in front of the second portion of region 24, of region 66, and of layer 36. More precisely, layers 76 and 78 are etched in such a way that the remaining lateral walls of region 40 and of layer 78 are located in front of portions 74.

Thus, the portions of layers 76 and 78 located in front of layer 58 are removed. The portions of layers 76 and 78 located in front of the periphery of layer 36, that is, located in front of the portions of portions 74 closest to layer 58, are etched during this etch step. The portions of layers 76 and 78 located in front of the portion of layer 36 not covered with portions 74 and the portions of portions 74 most distant from layer 58, are not etched during this etch step. Thus, region 40 and the rest of layer 78 entirely cover the portion of layer 36 not covered with portions 74 and partially covers portions 74. For example, region 40 and the rest of layer 78 cover a central portion of the assembly comprising portions 74 and layer 36.

Figure 2H:
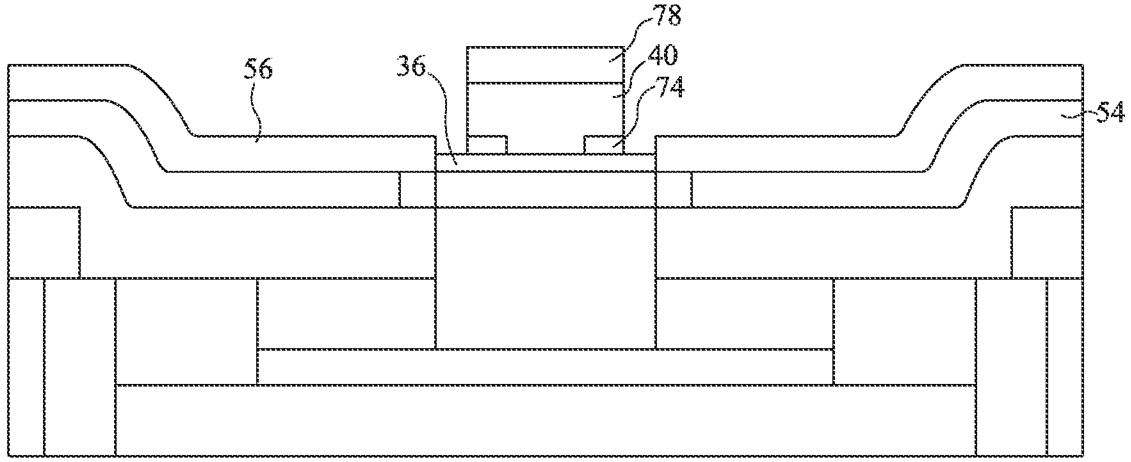

FIG. 2H shows a device resulting from a step of the method of manufacturing the embodiment of FIG. 1.

During this step, layer 58 and portions 74 are etched. More precisely, the step of FIG. 2H comprises a step of etching of the material of layer 58 and of portions 74. This etch step is, for example, a wet etching. This etching simultaneously removes layer 58 and the portions of portions 74 which are not located under region 40. The etching is stopped to remove layer 58 and portions 74 without reaching layer 56 and layer 36.

Layer 58 and portions 74 form a layer of constant thickness. Thus, the etching removes the material of layer 58 and of portions 74 substantially at the same rate. The etching of the entire layer 58 and of all the portions 74 thus substantially ends at the same time. The material of layer 36 is thus not etched during the etching of layer 58 and of portions 74. It is thus not necessary to protect layer 36 with region 40. It is possible to decrease the dimensions of region 40 without causing damage in layer 36.

Figure 2I:
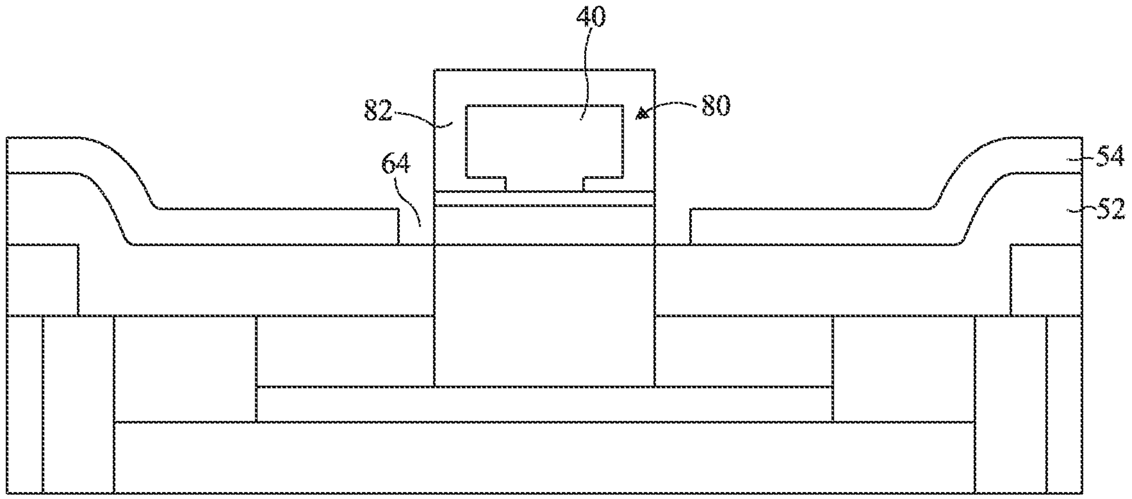

FIG. 2I shows a device resulting from a step of the method of manufacturing the embodiment of FIG. 1.

During this step, region 40 is encapsulated in a layer 80 of insulating material, preferably the material of layer 78, for example silicon oxide.

Layer 80 encapsulating region 40 comprises layer 78, portions 74, and layers 82 covering the lateral walls of region 40. Encapsulation layer 80 is preferably only located in front of layer 36. Thus, the upper surface of layer 56 is not, preferably, covered, even partially, with layer 80.

The step of FIG. 2I further comprises the removal of layer 56, for example by wet etching. Layer 56 is preferably entirely removed. Layer 54 is thus exposed. In particular, upper surface of layer 54 is exposed and the side edges of layer 54 at the cavities 64 are exposed.

Figure 2J:
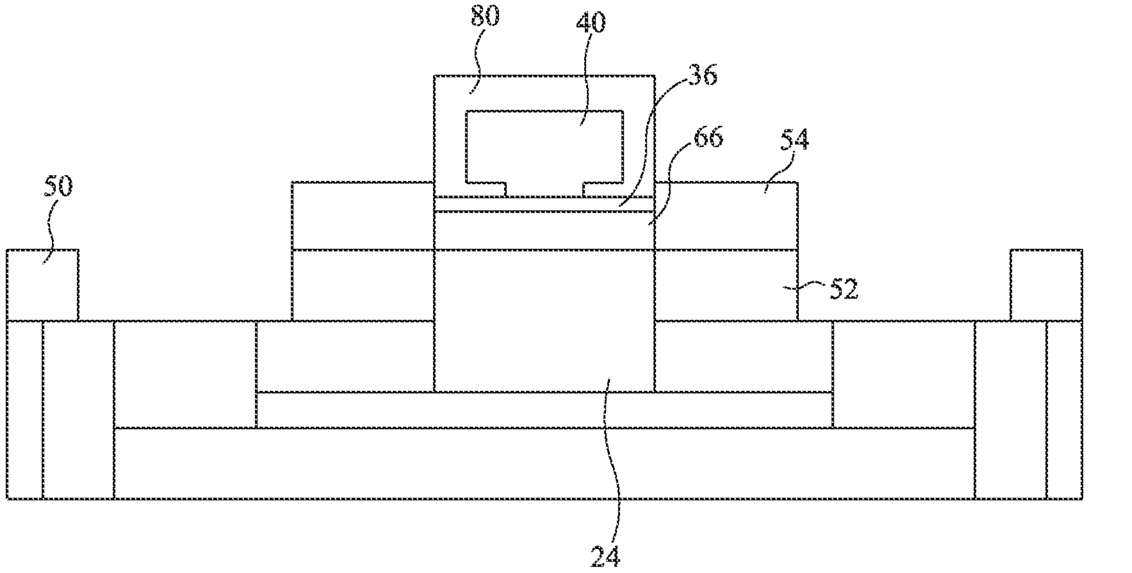

FIG. 2J shows a device resulting from a step of the method of manufacturing the embodiment of FIG. 1.

The step of FIG. 2J comprises a step of epitaxial growth of layer 54. The epitaxial growth is maintained so that cavities 64 are filled and so that layer 54 reaches at least the location of region 32 of FIG. 1.

Layer 54 and layer 52 are then etched to only keep the portions of layers 52 and 54 directly located around the assembly comprising region 24, region 66, layer 36, layer 80, and region 40. Layers 52 and 54 are preferably etched to keep the portion of layer 54 located at the location of region 32 of FIG. 1 and the portion of layer 52 located under said portion.

The method further comprises additional steps to obtain the device of FIG. 1. In particular, the method comprises: the removal of encapsulation layer 80; the forming of spacers 44 on the lateral walls of region 40; the growth of region 66 and the diffusion of the charges to form region 30; and the forming of conductive layers 21, 23, 34, and 42.

An advantage of the described embodiments is that the extrinsic base resistance is lower than that of a known bipolar transistor. The maximum oscillation frequency is thus higher.

Another advantage of the described embodiments is that it is possible to form an emitter region smaller than in a known bipolar transistor.

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove.

The invention claimed is:

1. A method of manufacturing a bipolar transistor, comprising:

a) manufacturing a first portion of a collector region in a substrate;

b) forming a stack of layers comprising a first layer made of a material of a base region and an insulating second layer made of a first material;

c) forming a cavity crossing the stack of layers to reach the first portion of the collector region in the substrate;

d) forming a second portion of the collector region and a first portion of the base region in the cavity;

e) forming an insulating fourth layer made of the first material in a periphery of a bottom of the cavity over the first portion of the base region, the insulating fourth layer having a same thickness as the insulating second layer;

f) forming an emitter region in front of the first portion of the base region, wherein a portion of the insulating fourth layer is not covered by the emitter region;

g) simultaneously removing the insulating second layer and the portion of the insulating fourth layer not covered by the emitter region; and after step g), h) epitaxially growing on the first layer to form a second portion of the base region.

2. The method according to claim 1, wherein step a) comprises forming an insulating layer covering a portion of the first portion of the collector region, and wherein forming the cavity comprises forming the cavity to cross through the insulating layer to reach the first portion of the collector region.

3. The method according to claim 1, wherein the stack of layers comprises an insulating fifth layer, the first layer, and the insulating second layer located between two insulating sixth layers, the two insulating sixth layers being made of materials different from the first material of the insulating second layer.

4. The method according to claim 1, wherein step d) comprises epitaxially growing the second portion of the collector region and the first portion of the base region in the cavity.

5. The method according to claim 1, wherein step e) comprises forming the insulating fourth layer, and further comprising: forming spacers on the insulating fourth layer against lateral walls of the cavity, wherein a central portion of a bottom of the cavity is not covered with the spacers, and etching portions of the insulating fourth layer which are not covered with the spacers.

6. The method according to claim 1, wherein step f) comprises forming a seventh layer made of a material of the emitter region and etching the seventh layer to partially expose the insulating fourth layer around the emitter region.

7. The method according to claim 1, wherein at step f) an upper surface of said portion of the insulating fourth layer is not covered by the emitter region.

8. The method according to claim 1, wherein the same thickness of the insulating second and fourth layers is in a range from 5 nm to 30 nm.

9. A method of manufacturing a bipolar transistor, comprising:

a) manufacturing a first portion of a collector region in a substrate;

b) forming a stack of layers comprising a first layer made of a material of a base region and an insulating second layer made of a first material;

c) forming a cavity crossing the stack of layers to reach the first portion of the collector region in the substrate;

d) forming a second portion of the collector region and a first portion of the base region in the cavity:

e) forming an insulating fourth layer made of the first material in a periphery of a bottom of the cavity over the first portion of the base region, the insulating fourth layer having a same thickness as the insulating second layer;

wherein step e) comprises forming the insulating fourth layer over the entire structure, and further comprising: forming spacers on the insulating fourth layer against lateral walls of the cavity, wherein a central portion of a bottom of the cavity is not covered with the spacers, and etching portions of the insulating fourth layer which are not covered with the spacers;

f) forming an emitter region in front of the first portion of the base region, wherein a portion of the insulating fourth layer is not covered by the emitter region;

f1) removing the spacers covering the insulating second layer; and g) simultaneously removing the insulating second layer and the portion of the insulating fourth layer not covered by the emitter region.

10. The method according to claim 9, comprising, after step g), a step h) epitaxially growing on the first layer to form a second portion of the base region.

11. The method according to claim 9, wherein step a) comprises forming an insulating layer covering a portion of the first portion of the collector region, and wherein forming the cavity comprises forming the cavity to cross through the insulating layer to reach the first portion of the collector region.

12. The method according to claim 9, wherein the stack of layers comprises an insulating fifth layer, the first layer, and the insulating second layer located between two insulating sixth layers, the two insulating sixth layers being made of materials different from the first material of the insulating second layer.

13. The method according to claim 9, wherein step d) comprises epitaxially growing the second portion of the collector region and the first portion of the base region in the cavity.

14. The method according to claim 9, wherein step e) comprises forming the insulating fourth layer, and further comprising: forming spacers on the insulating fourth layer against lateral walls of the cavity, wherein a central portion of a bottom of the cavity is not covered with the spacers, and etching portions of the insulating fourth layer which are not covered with the spacers.

15. The method according to claim 9, wherein step f) comprises forming a seventh layer made of a material of the emitter region and etching the seventh layer to partially expose the insulating fourth layer around the emitter region.

16. The method according to claim 9, wherein at step f) an upper surface of said portion of the insulating fourth layer is not covered by the emitter region.

17. The method according to claim 9, wherein the same thickness of the insulating second and fourth layers is in a range from 5 nm to 30 nm.

18. A method of manufacturing a bipolar transistor, comprising:

a) manufacturing a first portion of a collector region in a substrate;

b) forming a stack of layers comprising a first layer made of a material of a base region and an insulating second layer made of a first material;

wherein the stack of layers comprises an insulating fifth layer, the first layer, and the insulating second layer located between two insulating sixth layers, the insulating sixth layers being made of materials different from the first material of the insulating second layer;

c) forming a cavity crossing the stack of layers to reach the first portion of the collector region in the substrate;

d) forming a second portion of the collector region and a first portion of the base region in the cavity:

e) forming an insulating fourth layer made of the first material in a periphery of a bottom of the cavity over the first portion of the base region, the insulating fourth layer having a same thickness as the insulating second layer:

f) forming an emitter region in front of the first portion of the base region, wherein a portion of the insulating fourth layer is not covered by the emitter region;

g) simultaneously removing the insulating second layer and the portion of the insulating fourth layer not covered by the emitter region; then h) epitaxially growing on the first layer to form a second portion of the base region; and then i) etching the first layer and the insulating fifth layer to partially expose the first portion of the collector region.

19. The method according to claim 18, comprising, after step i), forming contact layers on the base, collector, and emitter regions.

20. The method according to claim 18, wherein step a) comprises forming an insulating layer covering a portion of the first portion of the collector region, and wherein forming the cavity comprises forming the cavity to cross through the insulating layer to reach the first portion of the collector region.

21. The method according to claim 18, wherein step d) comprises epitaxially growing the second portion of the collector region and the first portion of the base region in the cavity.

22. The method according to claim 18, wherein step e) comprises forming the insulating fourth layer, and further comprising: forming spacers on the insulating fourth layer against lateral walls of the cavity, wherein a central portion of a bottom of the cavity is not covered with the spacers, and etching portions of the insulating fourth layer which are not covered with the spacers.

23. The method according to claim 18, wherein step f) comprises forming a seventh layer made of a material of the emitter region and etching the seventh layer to partially expose the insulating fourth layer around the emitter region.

24. The method according to claim 18, wherein at step f) an upper surface of said portion of the insulating fourth layer is not covered by the emitter region.

25. The method according to claim 18, wherein the same thickness of the insulating second and fourth layers is in a range from 5 nm to 30 nm.

* * * * *